(12) United States Patent
Sawabe et al.

(10) Patent No.: US 7,628,856 B2
(45) Date of Patent: Dec. 8, 2009

(54) METHOD FOR PRODUCING SUBSTRATE FOR SINGLE CRYSTAL DIAMOND GROWTH

(75) Inventors: Atsuhito Sawabe, Yokosuka (JP); Hitoshi Noguchi, Gunma (JP); Shintaro Maeda, Ibi-gun (JP)

(73) Assignees: Shin-Etsu Chemical Co., Ltd., Tokyo (JP); AGD Material Co., Tokyo (JP)

( * ) Notice: Subject to any disclaimer, the term of this patent is extended or adjusted under 35 U.S.C. 154(b) by 193 days.

(21) Appl. No.: 11/713,036

(22) Filed: Mar. 2, 2007

(65) Prior Publication Data

US 2007/0209578 A1   Sep. 13, 2007

(30) Foreign Application Priority Data

Mar. 8, 2006 (JP) .............................. 2006-063376

(51) Int. Cl.
*C30B 29/02* (2006.01)
(52) U.S. Cl. .............................. 117/91; 117/92; 117/94; 117/95; 117/929
(58) Field of Classification Search ................... 117/91, 117/92, 94, 95, 929; 423/446
See application file for complete search history.

(56) References Cited

U.S. PATENT DOCUMENTS

| | | | | |
|---|---|---|---|---|
| 5,397,428 A | * | 3/1995 | Stoner et al. ................... | 117/86 |
| 5,854,495 A | | 12/1998 | Buhaenko et al. | |
| 5,863,324 A | * | 1/1999 | Kobashi et al. ................ | 117/89 |
| 5,964,942 A | * | 10/1999 | Tanabe et al. ................... | 117/87 |
| 2006/0001029 A1 | * | 1/2006 | Hayashi et al. ................. | 257/77 |

FOREIGN PATENT DOCUMENTS

| JP | A 5-85892 | 4/1993 |
|---|---|---|
| JP | A 8-133892 | 5/1996 |
| JP | A 2005-335988 | 12/2005 |

OTHER PUBLICATIONS

N. Ishigaki et al., "Observation of Diamond Nucleation During Bias Treatment", New Diamonds and Frontier Carbon Technology vol. 13, No. 6, 2003, pp. 323-331.
K. Ohtsuka et al., "Epitaxial Growth of Diamond on Iridium", Jp. J. Appl. Phys. vol. 35, Aug. 1996, pp. 1072-1074.
"New Diamond", vol. 18, No. 4, 2002, pp. 6-12.
65th Japan Society of Applied Physics Academic Lecture Preliminary Report, No. 2, 2004, p. 508.
Instruction Book: "Chino Inst No. IR-274-P5CE," May 2005.

* cited by examiner

*Primary Examiner*—Robert M Kunemund
(74) *Attorney, Agent, or Firm*—Oliff & Berridge, PLC

(57) ABSTRACT

There is disclosed a method for producing a substrate for single crystal diamond growth, comprising at least a step of preliminarily subjecting a substrate before single crystal diamond growth to a bias treatment for forming a diamond nucleus thereon by a direct-current discharge in which an electrode in a substrate side is a cathode, and wherein in the treatment, at least, a temperature of the substrate from 40 sec after an initiation of the bias treatment to an end of the bias treatment is held in a range of 800° C.±60° C. There can be provided a method for producing a substrate for single crystal diamond growth, by which a single crystal diamond can be grown more certainly.

16 Claims, 3 Drawing Sheets

(a)

(b)

(c)

(a)

(b)

(c)

METHOD FOR PRODUCING SUBSTRATE FOR SINGLE CRYSTAL DIAMOND GROWTH

BACKGROUND OF THE INVENTION

1. Field of the Invention

The present invention relates to a method for producing a substrate for single crystal diamond growth.

2. Description of the Related Art

Diamond has a wide band gap of 5.47 eV and a very high dielectric breakdown electric field intensity of 10 MV/cm. Furthermore, it has the highest thermal conductivity in materials. Therefore, if this is used for an electronic device, the device is advantageous as a high output power device.

On the other hand, diamond has high drift mobility and is the most advantageous as a high-speed power device in semiconductors in comparison of Johnson performance index.

Accordingly, diamond is said to be the ultimate semiconductor suitable for high frequency/high power electronic devices.

Therefore, a multilayer substrate in which a diamond film and the like is laminated on a substrate has attracted attention.

Now, most of the single crystal diamonds for fabrication of a diamond semiconductor are diamonds referred to as Ib type formed by a high-pressure method. The Ib-type diamonds contain a large amount of nitrogen impurities and can only be obtained at a size of no more than about a 5-mm squar. Therefore, their utility is low.

By contrast, there is an advantage that by Chemical Vapor Deposition (CVD) method, a diamond of a relatively large area can be obtained with high purity.

Before growing a diamond film by this CVD method, a so-called bias treatment for forming a nucleus of diamond on a substrate before single crystal diamond growth by a direct-current discharge in which an electrode in a substrate side is a cathode has been performed.

For example, in Jpn. J. Appl. Phys. Vol. 35 (1996) pp. L1072-L1074 and NEW DIAMOND, Vol. 18 No. 4, (2002), pp. 6-12, a substrate for single crystal diamond growth has been produced by performing such a bias treatment at an Ir substrate temperature of 900° C. before the diamond growth. And, it has been reported that on the substrate, the diamond growth is performed by a DC plasma CVD method, and thereby a diamond grain having a uniform orientation can be grown.

Moreover, in 65th Japan Society of Applied Physics Academic Lecture Preliminary Report No. 2 (2004), pp. 508, it has been described that the bias treatment is performed at an Ir substrate temperature of 920° C. before the diamond growth, and it has been reported that the same result as the above-described Jpn. J. Appl. Phys. Vol. 35 (1996) pp. L1072-L1074 and NEW DIAMOND, Vol. 18 No. 4, (2002), pp. 6-12 can be obtained.

However, the above-described Jpn. J. Appl. Phys. Vol. 35 (1996) pp. L1072-L1074, NEW DIAMOND, Vol. 18 No. 4, (2002), pp. 6-12, and 65th Japan Society of Applied Physics Academic Lecture Preliminary Report No. 2 (2004), pp. 508 do not quite describe details about a method for measuring the temperature of the substrate, a condition thereof, a place for the measurement, and so forth. Furthermore, in experiments by the present inventor, even when any one of the other conditions complies with a condition described in the above-described Jpn. J. Appl. Phys. Vol. 35 (1996) pp. L1072-L1074 NEW DIAMOND, Vol. 18 No. 4, (2002), pp. 6-12, or 65th Japan Society of Applied Physics Academic Lecture Preliminary Report No. 2 (2004), pp. 508, it has been impossible to grow a single crystal diamond, on the substrate subjected to the bias treatment at approximately 900° C.

SUMMARY OF THE INVENTION

The present invention has been made to solve the above-mentioned problems, and a main object of the present invention is to provide a method for producing a substrate for single crystal diamond growth, by which a single crystal diamond can be grown more certainly.

The present invention is made in order to solve the above problems, the present invention provides a method for producing a substrate for single crystal diamond growth, comprising at least a step of preliminarily subjecting a substrate before single crystal diamond growth to a bias treatment for forming a diamond nucleus thereon by a direct-current discharge in which an electrode in a substrate side is a cathode, and wherein in the treatment, at least, a temperature of the substrate from 40 sec after an initiation of the bias treatment to an end of the bias treatment is held in a range of 800° C.±60° C.

By, at least, holding a temperature of the substrate from 40 sec after an initiation of the bias treatment to an end of the bias treatment to be in a range of 800° C.±60° C. in the bias treatment as described above, a single crystal diamond can be grown more certainly.

Moreover, in the method for producing a substrate for single crystal diamond growth of the present invention, it is preferable that a current density in the bias treatment is set in a range of 120 to 230 mA/cm$^2$.

Moreover, in the method for producing a substrate for single crystal diamond growth of the present invention, it is preferable that a treatment time of the bias treatment is set in a range of 45 sec to 180 sec.

Moreover, in the method for producing a substrate for single crystal diamond growth of the present invention, it is preferable that an atmosphere in the bias treatment is methane diluted with hydrogen, and a concentration of the hydrogen-diluted methane is set in a range of $CH_4/(CH_4+H_2)$=0.5 to 5.0 vol. %.

Moreover, in the method for producing a substrate for single crystal diamond growth of the present invention, it is preferable that an atmosphere in the bias treatment is a mixed gas containing carbon and hydrogen atoms, a pressure of the atmosphere is in a range of 105 to 150 Torr.

Moreover, in the method for producing a substrate for single crystal diamond growth of the present invention, it is possible that as the substrate for single crystal diamond growth before the bias treatment, a single crystal iridium (Ir) is used.

Alternatively, it is possible that as the substrate for single crystal diamond growth before the bias treatment, an Ir film grown heteroepitaxially on a single crystal MgO substrate is used.

Furthermore, the present invention provides a method for producing a multilayer substrate, comprising a step of, performing growth on the above-described bias-treated substrate by a microwave CVD method or a direct-current plasma CVD method under a condition of a substrate temperature of 700° C. to 1400° C., and thereby producing a multilayer substrate including a single crystal diamond.

Moreover, the present invention provides a multilayer substrate including a single crystal diamond produced by the above-described method.

Moreover, the present invention provides an independent single crystal diamond substrate that is only a diamond taken out of the multilayer substrate produced by the method.

Furthermore, the present invention provides a device fabricated by using the above-described multilayer substrate including a single crystal diamond or the above-described independent single crystal diamond substrate.

As described above, by using the method for producing a substrate for single crystal diamond growth of the present invention, a single crystal diamond can be grown more certainly.

DETAILED DESCRIPTION OF THE PREFERRED EMBODIMENTS

Figure 1:
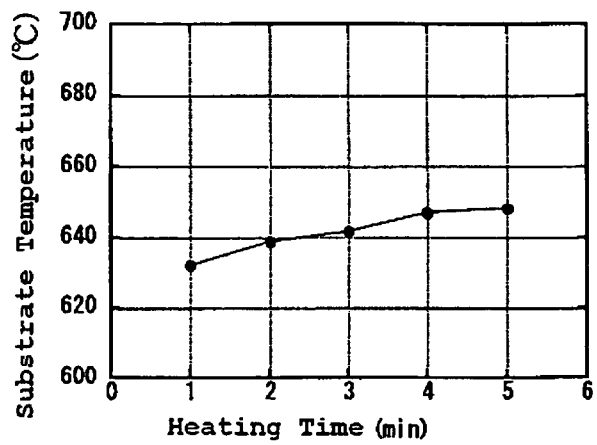
FIG. 1a to c are a graph showing the change of the substrate temperature before the bias treatment and in the bias treatment (Example 1).
Figure 1:
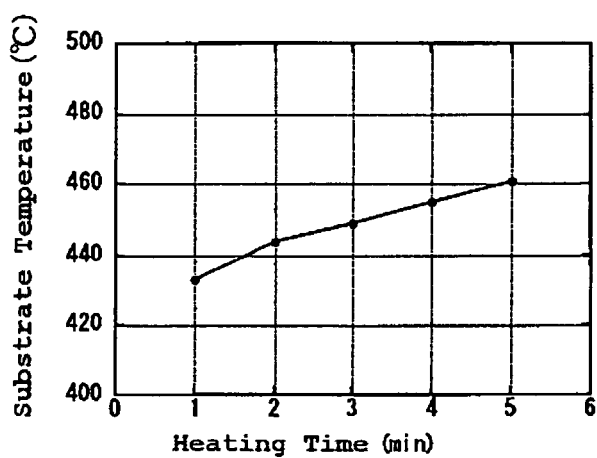
Figure 1:
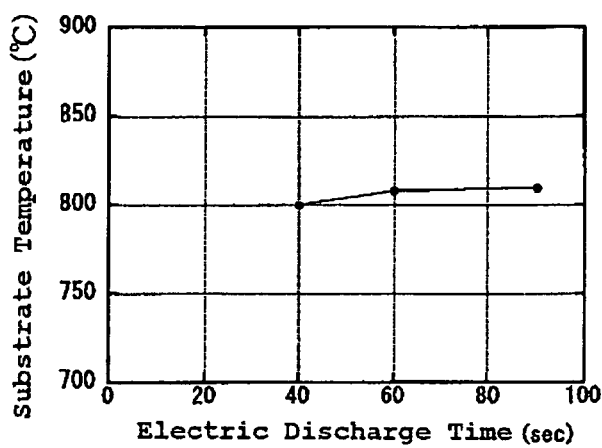

Hereinafter, embodiments of the present invention will be explained. However, the present invention is not limited thereto.

As described above, conventionally, even if a bias treatment is performed in order to preliminarily form a nucleus of diamond, there is a problem that a single crystal diamond cannot certainly grown on a substrate subjected to the bias treatment. Therefore, the present inventor has thoroughly investigated the condition of the bias treatment.

As a result, the present inventor has found that when the bias treatment is performed with setting a temperature of the substrate to be in a predetermined range, a single crystal diamond can be more certainly grown on the treated substrate, and thereby has accomplished the present invention.

That is, the method for producing a substrate for single crystal diamond growth of the present invention comprises at least a step of preliminarily subjecting a substrate before single crystal diamond growth to a bias treatment for forming a diamond nucleus thereon by a direct-current discharge in which an electrode in a substrate side is a cathode, and wherein in the treatment, at least, a temperature of the substrate from 40 sec after an initiation of the bias treatment to an end of the bias treatment is held in a range of 800° C.±60° C.

In order to grow a single crystal diamond more certainly, it is necessary that in the bias treatment, a temperature of the substrate from 40 sec after an initiation of the bias treatment to an end of the bias treatment is held in a range of 800° C.±60° C. as described above.

At a lower temperature (less than 740° C.) than this most appropriate temperature range, amorphous carbon is formed on the substrate and on the other hand, a diamond nucleus is not formed. Also, in a subsequent diamond growth process, a single crystal diamond is not grown. Reversely, at a higher temperature (higher than 860° C.) than this most appropriate temperature range, etching of the surface progresses and the diamond nucleus is not formed, and also in a subsequent diamond growth process, diamond is not grown.

Here, the measurement of the substrate temperature can be performed, for example, as follows.

The temperature of the substrate surface can be measured by the radiation thermometer IR-CAI2CS manufactured by CHINO CORPORATION.

In the radiation thermometer, the detection device is InGaAs, the measurement wavelength is 1.55 μm, and the temperature in the range of 300° C. to 1600° C. can be measured. In the measurement, it is necessary that the surface of the substrate which is an object to be measured is Ir, and that a radiation rate determined by crystallinity, surface shape, measurement temperature, measurement wavelength, and so forth, is set. However, because the strict setting is difficult, the radiation rate may be set to 0.3, which is a generally known radiation rate of a solid Ir in a wavelength of 0.65 μm (See, page 15 of instruction book: CHINO INST No. Ir-274-P5CE).

The actual measurement can be performed by, for example, setting a radiation thermometer outside a chamber using a tripod, and aligning the sight on a surface of the substrate in the chamber through a quartz window provided in the chamber.

Next, the other condition in the bias treatment will be described as follows.

It is preferable that a current density in the bias treatment is set in a range of 120 to 230 MA/cm$^2$.

Moreover, it is preferable that a treatment time of the bias treatment is set in a range of 45 sec to 180 sec.

Moreover, it is preferable that an atmosphere in the bias treatment is methane diluted with hydrogen, and a concentration of the hydrogen-diluted methane is set in a range of $CH_4/(CH_4+H_2)$=0.5 to 5.0 vol. %.

Moreover, it is preferable that an atmosphere in the bias treatment is a mixed gas containing carbon and hydrogen atoms, a pressure of the atmosphere is in a range of 105 to 150 Torr.

Next, as the substrate for diamond growth to be used in the bias treatment, the following substrate can be used.

That is, as the substrate for diamond growth before the bias treatment, a single crystal iridium (Ir) can be used.

Alternatively, as the substrate for diamond growth before the bias treatment, an Ir film grown heteroepitaxially on a single crystal MgO substrate can be used.

Furthermore, the present invention provides a method for producing a multilayer substrate, comprising a step of, performing growth on the above-described bias-treated substrate by a microwave CVD method or a direct-current plasma CVD method under a condition of a substrate temperature of 700° C. to 1400° C., and thereby producing a multilayer substrate including a single crystal diamond.

Moreover, the present invention provides a multilayer substrate including a single crystal diamond produced by the above-described method.

Moreover, the present invention provides an independent single crystal diamond substrate that is only a diamond taken out of the multilayer substrate produced by the above-described method.

Furthermore, the present invention provides a device fabricated by using the above-described multilayer substrate including a single crystal diamond or the above-described independent single crystal diamond substrate.

EXAMPLE

Hereinafter, the present invention will be explained more specifically with reference to Example and Comparative examples. However, the present invention is not limited thereto.

Example 1

A double-side polished single crystal MgO substrate having a 10.0-mm square, a 0.5-mm thickness, and an orientation (100), was prepared.

And, an Ir film was heteroepitaxially grown on the side of this MgO substrate on which a diamond film would be formed. For electric connection, an Ir film was further grown on the back surface thereof.

Next, the bias treatment for forming a nucleus of diamond on the surface of the Ir film of this substrate was performed.

First, as the preparation before the bias treatment, the substrate was set on an electrode for applying a negative voltage (cathode), and vacuum evacuation was performed. Next, the substrate was heated (the first heating), and the temperature of the substrate was raised to 648° C. for 5 min (FIG. 1(a)). Next, a $CH_4/H_2$ gas was introduced, and the base pressure was set to 115 Torr. Next, the substrate was heated again (the second heating), and the temperature of the substrate was raised to 461° C. for 5 min (FIG. 1(b)).

Then, the bias treatment was performed. That is, a DC voltage (345 mA) was applied. At this time, the temperature of the substrate was raised to 800° C. for 40 sec, and further to 810° C. for 90 sec (FIG. 1(c)).

Last, on this substrate, a diamond was grown by a microwave (2.45 GHz) CVD method.

The obtained multilayer substrate was confirmed, and therefore, it was possible to confirm that a single crystal diamond could be grown.

Comparative Example 1

In the same manner as Example 1, an Ir film was heteroepitaxially grown on the side of the MgO substrate on which a diamond film would be formed. For electric connection, an Ir film was further grown on the back surface thereof.

Next, the bias treatment for forming a nucleus of diamond on the surface of the Ir film of this substrate was performed.

Figure 2:
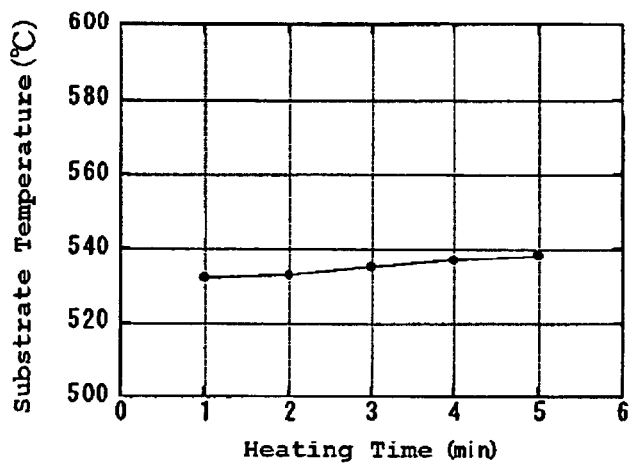
FIG. 2a to c are a graph showing the change of the substrate temperature before the bias treatment and in the bias treatment (Comparative example 1).
Figure 2:
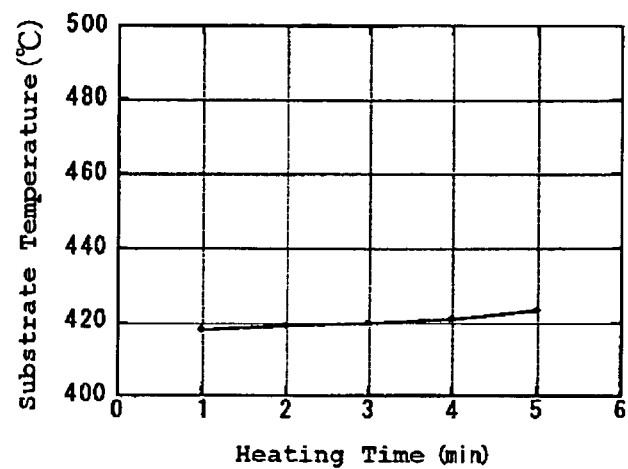
Figure 2:
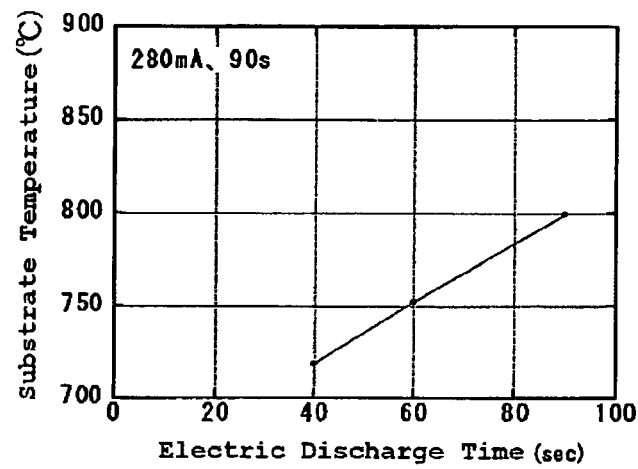

First, as the preparation before the bias treatment, the substrate was set on an electrode for applying a negative voltage (cathode), and vacuum evacuation was performed. Next, the substrate was heated (the first heating), and the temperature of the substrate was raised to 538° C. for 5 min (FIG. 2(a)). Next, a $CH_4/H_2$ gas was introduced, and the base pressure was set to 115 Torr. Next, the substrate was heated again (the second heating), and the temperature of the substrate was raised to 423° C. for 5 min (FIG. 2(b)).

Then, the bias treatment was performed. That is, a DC voltage (280 mA) was applied. At this time, the temperature of the substrate was raised to 720° C. for 40 sec, and further to 799° C. for 90 sec (FIG. 2(c)).

Last, it was attempted to grow a diamond on this substrate by a microwave (2.45 GHz) CVD method.

However, the obtained multilayer substrate was confirmed, and therefore, it was confirmed that a single crystal diamond could not be grown.

Comparative Example 2

In the same manner as Example 1, an Ir film was heteroepitaxially grown on the side of the MgO substrate on which a diamond film would be formed. For electric connection, an Ir film was further grown on the back surface thereof.

Next, the bias treatment for forming a nucleus of diamond on the surface of the Ir film of this substrate was performed.

Figure 3:
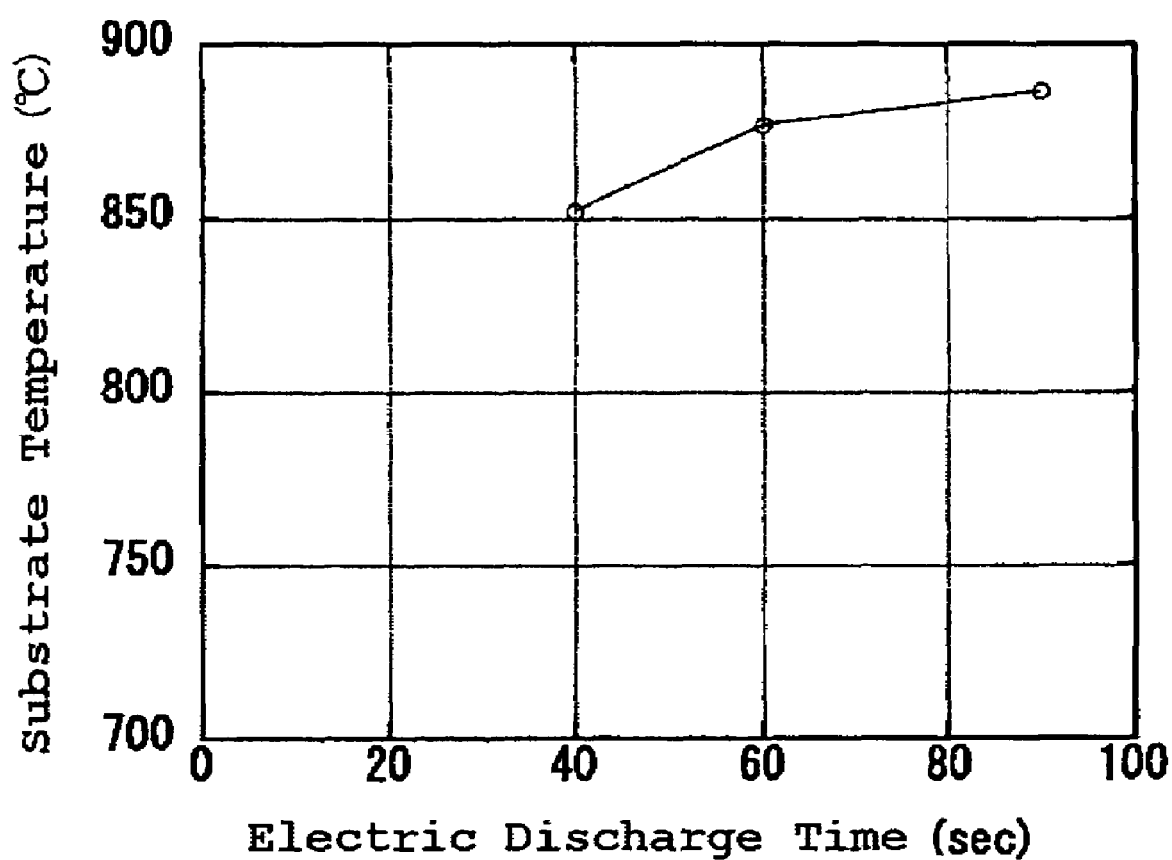
FIG. 3 is a graph showing the change of the substrate temperature in the bias treatment (Comparative example 2).

That is, after the predetermined preparation before the treatment, a DC voltage (400 mA) was applied. At this time, the temperature of the substrate was raised to 852° C. for 40 sec, and further to 887° C. for 90 sec (FIG. 3).

Last, it was attempted to grow a diamond on this substrate by a microwave (2.45 GHz) CVD method.

However, the obtained multilayer substrate was confirmed, and therefore, it was confirmed that a single crystal diamond could not be grown.

The present invention is not limited to the above-described embodiments. The above-described embodiments are mere examples and those having the substantially same constitution as that described in the appended claims and providing the similar functions and advantages are included in the scope of the present invention.

The invention claimed is:

1. A method for producing a substrate for single crystal diamond growth, comprising at least a step of preliminarily subjecting a substrate before single crystal diamond growth to a bias treatment for forming a diamond nucleus thereon, wherein the bias treatment consists essentially of a direct-current discharge in which an electrode in a substrate side is a cathode, and wherein in the treatment, at least, a temperature of the substrate from 40 sec after an initiation of the bias treatment to an end of the bias treatment is held in a range of 800° C.±60° C.

2. The method for producing a substrate for single crystal diamond growth according to claim 1, wherein a current density in the bias treatment is set in a range of 120 to 230 $mA/cm^2$.

3. The method for producing a substrate for single crystal diamond growth according to claim 1, wherein a treatment time of the bias treatment is set in a range of 45 sec to 180 sec.

4. The method for producing a substrate for single crystal diamond growth according to claim 2, wherein a treatment time of the bias treatment is set in a range of 45 sec to 180 sec.

5. The method for producing a substrate for single crystal diamond growth according to claim 1, wherein an atmosphere in the bias treatment is methane diluted with hydrogen, and a concentration of the hydrogen-diluted methane is set in a range of $CH_4/(CH_4+H_2)$=0.5 to 5.0 vol. %.

6. The method for producing a substrate for single crystal diamond growth according to claim 4, wherein an atmosphere in the bias treatment is methane diluted with hydrogen, and a concentration of the hydrogen-diluted methane is set in a range of $CH_4/(CH_4+H_2)$=0.5 to 5.0 vol. %.

7. The method for producing a substrate for single crystal diamond growth according to claim 1, wherein an atmosphere in the bias treatment is a mixed gas containing carbon and hydrogen atoms, a pressure of the atmosphere is in a range of 105 to 150 Torr.

8. The method for producing a substrate for single crystal diamond growth according to claim 6, wherein an atmosphere in the bias treatment is a mixed gas containing carbon and hydrogen atoms, a pressure of the atmosphere is in a range of 105 to 150 Torr.

9. The method for producing a substrate for single crystal diamond growth according to claim 1, wherein as the substrate for single crystal diamond growth before the bias treatment, a single crystal iridium (Ir) is used.

10. The method for producing a substrate for single crystal diamond growth according to claim 8, wherein as the substrate for single crystal diamond growth before the bias treatment, a single crystal iridium (Ir) is used.

11. The method for producing a substrate for single crystal diamond growth according to claim 1, wherein as the substrate for single crystal diamond growth before the bias treatment, an Ir film grown heteroepitaxially on a single crystal MgO substrate is used.

12. The method for producing a substrate for single crystal diamond growth according to claim 8, wherein as the substrate for single crystal diamond growth before the bias treatment, an Ir film grown heteroepitaxially on a single crystal MgO substrate is used.

13. A method for producing a multilayer substrate, comprising a step of, performing growth on the bias-treated substrate according to claim 1 by a microwave CVD method or a direct-current plasma CVD method under a condition of a substrate temperature of 700° C. to 1400° C., and thereby producing a multilayer substrate including a single crystal diamond.

14. A method for producing a multilayer substrate, comprising a step of, performing growth on the bias-treated substrate according to claim 10 by a microwave CVD method or a direct-current plasma CVD method under a condition of a substrate temperature of 700° C. to 1400° C., and thereby producing a multilayer substrate including a single crystal diamond.

15. A method for producing a multilayer substrate, comprising a step of, performing growth on the bias-treated substrate according to claim 12 by a microwave CVD method or a direct-current plasma CVD method under a condition of a substrate temperature of 700° C. to 1400° C., and thereby producing a multilayer substrate including a single crystal diamond.

16. The method for producing a substrate for single crystal diamond growth according to claim 1, wherein the bias treatment consists of the direct-current discharge.

* * * * *